(12) United States Patent
Kim et al.

(10) Patent No.: US 10,604,687 B2
(45) Date of Patent: Mar. 31, 2020

(54) TRANSPARENT ADHESIVE COMPOSITION, TRANSPARENT ADHESIVE LAYER AND DISPLAY DEVICE INCLUDING THE SAME

(71) Applicant: LG Display Co., Ltd., Seoul (KR)

(72) Inventors: Jae-Yeong Kim, Paju-si (KR); Eun-Ju Park, Gimpo-si (KR); Won-Bong Jang, Seoul (KR); Jun-Ha Hwang, Siheung-si (KR); Tae-Soo Jo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 200 days.

(21) Appl. No.: 15/383,111

(22) Filed: Dec. 19, 2016

(65) Prior Publication Data

US 2017/0190942 A1     Jul. 6, 2017

(30) Foreign Application Priority Data

Dec. 30, 2015   (KR) ........................ 10-2015-0189813

(51) Int. Cl.
*C09J 183/04*         (2006.01)
*C09D 143/04*         (2006.01)
(Continued)

(52) U.S. Cl.
CPC ............. *C09J 183/04* (2013.01); *B32B 3/266* (2013.01); *B32B 7/12* (2013.01); *B32B 9/04* (2013.01);
(Continued)

(58) Field of Classification Search
CPC ... C09J 143/04; C09J 4/00; C09J 11/06; C09J 183/04; C09J 2203/318; C09J 9/00; C08F 230/08; C08K 5/5419; B32B 15/04; B32B 15/20; B32B 17/00; B32B 2250/44; B32B 2307/206; B32B 2307/306; B32B 2307/40; B32B 2307/412; B32B 2307/42; B32B 2307/50; B32B 2307/702; B32B 2307/704; B32B 2307/73; B32B 2457/20; B32B 27/06; B32B 27/281; B32B 3/266; B32B 7/12; B32B 9/04; B32B 9/041; B32B 9/045; C09D 143/04; G02F 1/13338;
(Continued)

(56) References Cited

U.S. PATENT DOCUMENTS 4,478,990 A * 10/1984 Kohno ................. C09D 143/04
                                                              525/326.5
5,631,082 A *  5/1997 Hirose ................. C09J 201/10
                                                              428/343
(Continued)

FOREIGN PATENT DOCUMENTS

CN         101903483 A         12/2010
CN         102763027 A         10/2012
(Continued)

OTHER PUBLICATIONS

Office Action and Search Report dated Aug. 5, 2019 with English translation issued in the corresponding Chinese Application No. 201611139710.8, 24 Pages.

*Primary Examiner* — Michael B Nelson
(74) *Attorney, Agent, or Firm* — Polsinelli PC

(57) ABSTRACT

There is further provided a transparent adhesive composition including a silicon acrylate monomer; a silanol compound; an alkoxy silane compound; and an optical initiator.

9 Claims, 4 Drawing Sheets

(51) Int. Cl.
    *C09J 143/04*     (2006.01)
    *C09J 4/00*     (2006.01)
    *B32B 15/04*     (2006.01)
    *B32B 9/04*     (2006.01)
    *B32B 27/28*     (2006.01)
    *B32B 3/26*     (2006.01)
    *B32B 17/00*     (2006.01)
    *B32B 15/20*     (2006.01)
    *B32B 27/06*     (2006.01)
    *B32B 7/12*     (2006.01)
    *C09J 9/00*     (2006.01)
    *C09J 11/06*     (2006.01)
    *H01L 51/00*     (2006.01)
    *H01L 51/52*     (2006.01)
    *G02F 1/1333*     (2006.01)
    *H01L 27/32*     (2006.01)

(52) U.S. Cl.
    CPC .............. *B32B 9/041* (2013.01); *B32B 9/045* (2013.01); *B32B 15/04* (2013.01); *B32B 15/20* (2013.01); *B32B 17/00* (2013.01); *B32B 27/06* (2013.01); *B32B 27/281* (2013.01); *C09D 143/04* (2013.01); *C09J 4/00* (2013.01); *C09J 9/00* (2013.01); *C09J 11/06* (2013.01); *C09J 143/04* (2013.01); *H01L 51/0094* (2013.01); *H01L 51/5246* (2013.01); *B32B 2250/44* (2013.01); *B32B 2307/206* (2013.01); *B32B 2307/306* (2013.01); *B32B 2307/40* (2013.01); *B32B 2307/412* (2013.01); *B32B 2307/42* (2013.01); *B32B 2307/50* (2013.01); *B32B 2307/702* (2013.01); *B32B 2307/704* (2013.01); *B32B 2307/73* (2013.01); *B32B 2457/20* (2013.01); *C09J 2203/318* (2013.01); *G02F 1/13338* (2013.01); *G02F 2001/133331* (2013.01); *G02F 2202/28* (2013.01); *H01L 27/3244* (2013.01); *H01L 51/004* (2013.01); *H01L 51/5253* (2013.01); *H01L 51/5281* (2013.01)

(58) Field of Classification Search
    CPC ...... G02F 2001/133331; G02F 2202/28; H01L 27/3244; H01L 51/004; H01L 51/0094; H01L 51/5246; H01L 51/5253; H01L 51/5281
    See application file for complete search history.

(56) References Cited

U.S. PATENT DOCUMENTS

| | | | |
|---|---|---|---|
| 6,362,301 B1* | 3/2002 | Bowe | C08F 2/02 525/326.5 |
| 2012/0301635 A1* | 11/2012 | Hasegawa | C08J 7/042 428/1.32 |
| 2015/0261368 A1* | 9/2015 | Chen | G06F 3/0412 345/173 |
| 2017/0137601 A1* | 5/2017 | Heikkinen | C08G 77/14 |

FOREIGN PATENT DOCUMENTS

| | | |
|---|---|---|
| CN | 104915047 A | 9/2015 |
| WO | WO 2015/193556 | * 12/2015 |

* cited by examiner

TRANSPARENT ADHESIVE COMPOSITION, TRANSPARENT ADHESIVE LAYER AND DISPLAY DEVICE INCLUDING THE SAME

CROSS-REFERENCE TO RELATED APPLICATION

The present application claims the benefit of Korean Patent Application No. 10-2015-0189813 filed in the Republic of Korea on Dec. 30, 2015, which is hereby incorporated by reference in its entirety.

BACKGROUND

Field of the Disclosure

The present disclosure relates to a display device, and more particularly, to a transparent adhesive composition, a transparent adhesive layer, and a display device including the same. Although the present disclosure is suitable for a wide scope of application, it is particularly suitable for improving adhesion property and optical property of a display device including a transparent adhesive layer.

Description of the Background

As information technology and mobile communication technology have been developed, a display device capable of displaying a visual image has also been developed. Flat panel display devices, such as a liquid crystal display (LCD) device and an OLED device, are developed and used instead of a cathode ray tube (CRT).

To prevent damages on the display device from an external impact, the display device includes a cover glass on a display surface.

FIG. 1 is a schematic view of the related art display device.

As shown in FIG. 1, the display device 10 includes a display panel 20, a cover glass 30 disposed over a display surface of the display panel 20 and a transparent adhesive layer 40 between the cover glass 30 and the display panel 20. The cover glass 30 and the display panel 20 are attached by the transparent adhesive layer 40.

The display panel 20 may be a liquid crystal panel or a light emitting diode panel.

For example, the display panel 20 as the liquid crystal panel includes first and second substrates facing each other, a pixel electrode and a common electrode generating an electric field, a liquid crystal layer between the first and second substrates and first and second polarization plates at an outer side of each of the first and second substrates.

In this instance, the cover glass 30 is attached onto the second polarization plate at the outer side of the second substrate using the adhesive layer 40. Accordingly, the display panel 20 is protected by the cover glass 30 such that the damages on the display panel 20 can be minimized.

For example, the transparent adhesive layer 40 is formed of an urethane acrylate compound. However, the transparent adhesive layer 40 of the urethane acrylate compound is very weak under high temperature and humidity condition.

In the high temperature condition (e.g., about 105° C.), a yellowish problem of the transparent adhesive layer 40 can be generated. In addition, in the high temperature and humidity condition (about 85° C., 85%), a haze value of the transparent adhesive layer 40 can be increased and the transparent adhesive layer 40 can be partially melt.

Namely, when the transparent adhesive layer 40 of the urethane acrylate compound is used at the high temperature and high humidity conditions, a free volume is strongly or rapidly increased such that moisture is penetrated into the free volume. As a result, optical, chemical and physical properties of the transparent adhesive layer 40 are deteriorated.

On the other hand, to overcome the weak heat-resistance property of the urethane acrylate compound, a silicon acrylate compound is suggested to form a transparent adhesive layer. A bonding energy of Si—O in the silicon acrylate compound is greater than a bonding energy of C—C and O—O in the urethane acrylate compound, so that the silicon acrylate compound has the heat-resistance property being better than the urethane acrylate compound.

However, the adhesion property (or strength) of the transparent adhesive layer of the silicon acrylate compound is worse than the transparent adhesive layer of the urethane acrylate compound. Accordingly, a peeling problem of the cover glass may be generated.

SUMMARY

Accordingly, the present disclosure is directed to a transparent adhesive composition, a transparent adhesive layer and a display device including the transparent adhesive layer that substantially obviate one or more of the problems due to limitations and disadvantages as described above.

Additional features and advantages of the invention will be set forth in the description which follows, and in part will be apparent from the description, or may be learned by practice of the disclosure. The objectives and other advantages of the invention will be realized and attained by the structure particularly pointed out in the written description and claims hereof as well as the appended drawings.

There is provided a transparent adhesive composition including a silicon acrylate monomer; a silanol compound; an alkoxy silane compound; and an optical initiator.

There is further provided a transparent adhesive layer including a polymer matrix of silicon acrylate; a silanol compound dispersed in the polymer matrix; and an alkoxy silane moiety combined to the polymer matrix.

There is further provided a transparent adhesive layer including a silanol compound; and an alkoxy silane moiety, wherein a haze value after exposing under a temperature condition of about 50 to 85° C. and a humidity condition of about 50 to 85% for a time more than about 250 hours is less than 1.5 times of an initial haze value.

There is further provided a display device including a display panel; a cover glass over the display panel; and a transparent adhesive layer between the display device and the cover glass, wherein the transparent adhesive layer includes: a polymer matrix of silicon acrylate; a silanol compound dispersed in the polymer matrix; and an alkoxy silane moiety combined to the polymer matrix.

There is further provided a display device including a display panel; a cover glass over the display panel; and a transparent adhesive layer between the display device and the cover glass, wherein the transparent adhesive layer includes: a silanol compound; and an alkoxy silane moiety, wherein the transparent adhesive layer has a haze value after exposing under a temperature condition of about 50 to 85° C. and a humidity condition of about 50 to 85% for a time more than about 250 hours being less than 1.5 times of an initial haze value.

It is to be understood that both the foregoing general description and the following detailed description are by example and explanatory and are intended to provide further explanation of the claimed subject-matter.

BRIEF DESCRIPTION OF THE DRAWINGS

The accompanying drawings, which are included to provide a further understanding of the disclosure and are incorporated in and constitute a part of this specification, illustrate aspects of the present disclosure and together with the description serve to explain the principles of the disclosure.

In the drawings.

DETAILED DESCRIPTION

Reference will now be made in detail to aspects of the disclosure, examples of which are illustrated in the accompanying drawings. Whenever possible, the same reference numbers will be used throughout the drawings to refer to the same or like parts.

Figure 1:
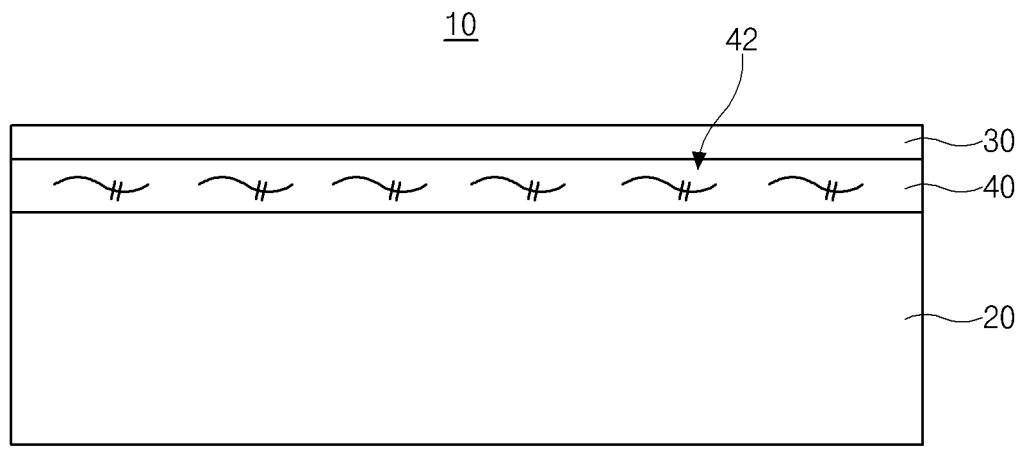
FIG. 1 is a schematic view of the related art display device.
Figure 2:
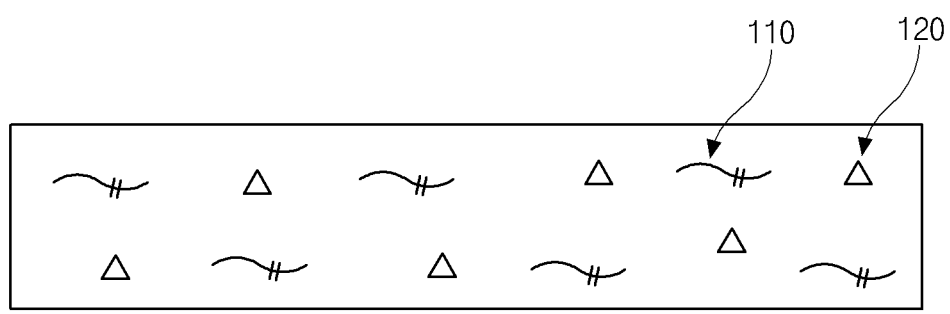
FIG. 2 is a schematic view illustrating a transparent adhesive layer according to an aspect of the present disclosure.

FIG. 2 is a schematic view illustrating a transparent adhesive layer according to an aspect of the present disclosure.

As shown in FIG. 2, a transparent adhesive layer (100, a transparent adhesive film) includes a silicon acrylate polymer matrix 110 and a tackifier 120 dispersed in the polymer matrix 110.

The tackifier 120 may be a silanol compound. A hydroxyl group (—OH) of the silanol compound as the tackifier 120 is combined with a hydroxyl group in the objective, where the transparent adhesive layer 100 is adhered, by a hydrogen bond such that an adhesion property (or strength) between the transparent adhesive layer and the objective can be improved or enhanced.

For example, the tackifier 120 may be represented by Formula 1.

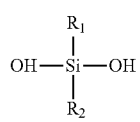

[Formula 1]

In the Formula 1, each of $R_1$ and $R_2$ may be C1 to C10 alkyl.

For example, the tackifier 120 may be represented by Formula 2.

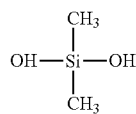

[Formula 2]

The tackifier 120 may have a weight % of about 5 to 10 with respect to the silicon acrylate compound such that the optical property of the transparent adhesive layer 100 is not decreased and the adhesion property of the transparent adhesive layer 100 is increased.

However, residual hydroxyl group, which is not combined with the objective, of the tackifier 120 may react with the water molecule, i.e., $H_2O$. Namely, since the residual hydroxyl group of the tackifier 120 reacts with the water molecule under the high humidity condition, the haze value of the transparent adhesive layer 100 is increased.

Particularly, since the silicon acrylate compound has a weak Van der Waal's force, the silicon compound inherently has a big free volume. Namely, in comparison to other compounds, e.g., the urethane acrylate compound, there are many spaces where the moisture can be penetrated.

The moisture penetration into the transparent adhesive layer 100 of the silicon acrylate compound is increased, and the residual hydroxyl group of the silanol tackifier 120, which is used for enhancing the adhesion strength of the transparent adhesive layer 100, reacts with the water molecule of the moisture, which is penetrated into the adhesive layer 100. As a result, the haze value increase in the transparent adhesive layer 100 is further problematic. In addition, the adhesion strength of the transparent adhesive layer 100 is remarkably reduced under the high temperature condition.

Figure 3:
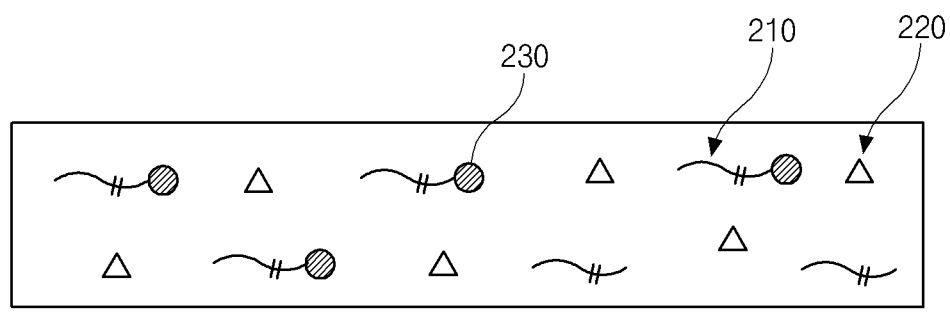
FIG. 3 is a schematic view illustrating a transparent adhesive layer according to another aspect of the present disclosure.

FIG. 3 is a schematic view illustrating a transparent adhesive layer according to another aspect of the present disclosure.

As shown in FIG. 3, a transparent adhesive layer (200, a transparent adhesive film) according to another aspect of the present disclosure includes a silicon acrylate polymer matrix 210, a tackifier 220 dispersed in the polymer matrix 210 and an alkoxy silane moiety 230 having a hydrophobic property.

The tackifier 220 may be a silanol compound. A hydroxyl group (—OH) of the silanol compound as the tackifier 220 is combined with a hydroxyl group in the objective, where the transparent adhesive layer 200 is adhered, by a hydrogen bond such that an adhesion property (or strength) between the transparent adhesive layer and the objective can be improved or enhanced.

For example, the tackifier 220 may be represented by the above Formula 1.

An alkoxy silane compound, which is represented by Formula 3, reacts with the polymer matrix 210 under UV irradiation such that the alkoxy silane moiety 230 is provided in the transparent adhesive layer 200.

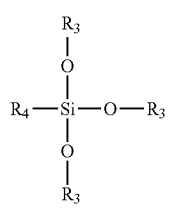

[Formula 3]

In Formula 3, $R_3$ may be C1 to C20 alkyl. Since the number of a carbon atom in the alkoxy silane compound is increased, the free volume in the transparent adhesive layer 200 may be increased such that the moisture penetration may be increased. Accordingly, the number of the carbon atom in $R_3$ may be less than 10. In addition, since the number of a carbon atom in the alkoxy silane compound is decreased, the transparent adhesive layer 200 may become brittle. Accordingly, the number of the carbon atom in $R_3$ may be more than 2. Namely, R3 in Formula 3 may be C2 to C10 alkyl.

In Formula 3, $R_4$ may be a vinyl group or an acrylate group. Namely, the alkoxy silane compound in the Formula 3 may be combined with the polymer matrix 210 through $R_4$.

For example, the alkoxy silane compound may be represented by Formula 4.

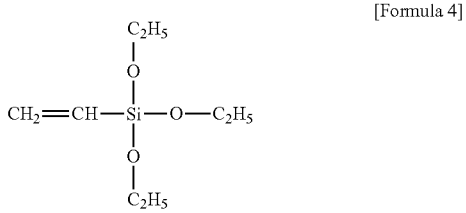

[Formula 4]

The alkoxy silane moiety 230 combined with the polymer matrix 210 may be represented by Formula 5.

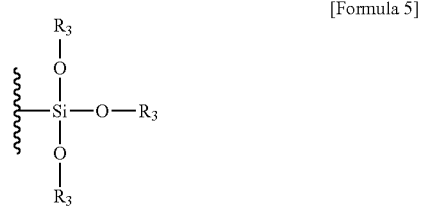

[Formula 5]

The alkoxy silane moiety 230 has a hydrophobic property due to the alkoxy moiety such that the transparent adhesive layer 200 may have a moisture (or water) resistance property. Namely, the moisture penetration into the transparent adhesive layer 200 may be prevented or minimized. Accordingly, the haze value increase problem from the reaction of the residual hydroxyl group in the tackifier 220 with the water molecule can be prevented or minimized.

Figure 4:
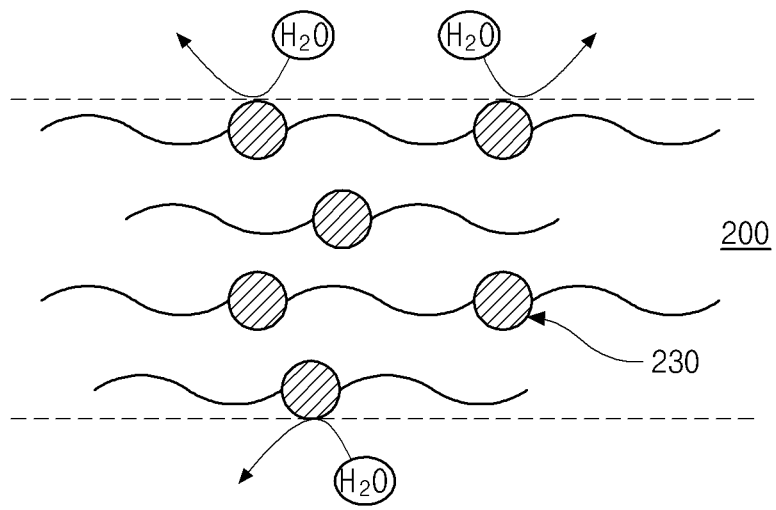
FIG. 4 is a schematic view illustrating a transparent adhesive layer preventing moisture penetration.

Namely, referring to FIG. 4, which is a schematic view illustrating a transparent adhesive layer preventing a moisture penetration, the moisture (or water) penetration is prevented by the alkoxy silane moiety having the hydrophobic property in the transparent adhesive layer 200.

In the transparent adhesive layer 200 according to another aspect of the present disclosure, the haze value increase problem being caused by the tackifier 120 and the free volume in the silicon acrylate compound can be prevented by the alkoxy silane moiety 230.

In addition, due to the alkoxy silane compound, not only the room temperature adhesion strength but also the high temperature adhesion strength of the transparent adhesive layer 200 are increased.

Accordingly, the present disclosure provides the transparent adhesive layer 200 having excellent heat-resistance property and adhesive property without a haze problem.

The Transparent Adhesive Composition

The transparent adhesive composition including a silicon-based monomer, an optical initiator, a silanol tackifier and an alkoxy silane compound is coated, and the UV is irradiated to cure the transparent adhesive composition. As a result, the transparent adhesive layer is provided.

For example, the silicon-based monomer may include at least one of vinyl terminated polydimethylsiloxanes and thiol terminated polydimethylsiloxanes. The optical initiator may include at least one of 2-hydroxy-2-methyl-1-phenyl-propan-1-one and 2,4,6-trimethylbenzoyl-diphenylphosphine oxide.

The silanol tackifier may be dimethylsilanediol, and the alkoxy silane compound may be vinyltriethoxysilane.

With respect to the silicon-based monomer, the optical initiator may have a weight % of about 10 to 15, and each of the silanol tackifier and the alkoxy silane compound may have a weight % of about 5 to 10.

The Adhesion Strength Test

The adhesion strength between the glass substrate and the transparent adhesive layer is tested and listed in Table 1.

The transparent adhesive layer (Example 1), which is formed from the adhesive composition including the silicon acrylate compound, the silanol tackifier (1 wt %) of the above Formula 2 and the alkoxy silane compound (1 wt %) of the above Formula 4, the transparent adhesive layer (Example 2), which is formed from the adhesive composition including the silicon acrylate compound, the silanol tackifier (5 wt %) of the above Formula 2 and the alkoxy silane compound (5 wt %) of the above Formula 4, the transparent adhesive layer (Example 3) without the alkoxy silane compound from Example 2, and the transparent adhesive layer (Example 4) without the alkoxy silane compound and the silane tackifier from the Example 2 are prepared.

TABLE 1

|  | shear strength [N/cm$^2$] | | tensile strength [N/cm$^2$] | |
| --- | --- | --- | --- | --- |
|  | 25° C. | 105° C. | 25° C. | 105° C. |
| Example 1 | 36.4 | 14.9 | 31.2 | 14.1 |
| Example 2 | 45.5 | 20.1 | 36.6 | 18.2 |
| Example 3 | 29.3 | 8.7 | 27.5 | 9.4 |
| Example 4 | 15.2 | 9.9 | 14.3 | 8.2 |

As shown in Table 1, in comparison to the transparent adhesive layer of Example 4, the room temperature adhesion strength between the glass substrate and the transparent adhesive layer of Example 3, which is formed from the adhesive composition further including the silanol tackifier, is increased, while the high temperature adhesion strength between the glass substrate and the transparent adhesive layer of Example 3 is not increased.

However, both the room temperature adhesion strength and the high temperature adhesion strength between the glass substrate and the transparent adhesive layer of Examples 1 and 2, which is formed from the adhesive composition further including the silanol tackifier and the alkoxy silane compound, are increased.

The Optical Property Test

The optical property, e.g., a yellowness index (YI) and a haze value, of the transparent adhesive layer of Examples 1 to 4 is tested and listed in Table 2.

TABLE 2

|  | YI | | | Haze | | |
| --- | --- | --- | --- | --- | --- | --- |
|  | 0 hr | 250 hr | 500 hr | 0 hr | 250 hr | 500 hr |
| Example 1 | 0.23 | 0.32 | 0.34 | 0.21 | 0.35 | 0.36 |
| Example 2 | 0.35 | 0.37 | 0.44 | 0.73 | 0.81 | 0.82 |
| Example 3 | 0.17 | 1.11 | ≫1.11 | 0.08 | 10.51 | ≫10.51 |
| Example 4 | 10.3 | ≫10.3 | ≫10.3 | 9.8 | ≫9.8 | ≫9.8 |

As shown in Table 2, the transparent adhesive layer of Example 4 does not have the desired yellowness index (<1) and the desired haze value (<1). The yellowness index and the haze value of the transparent adhesive layer of Example 3 are remarkably increased under the high temperature and high humidity conditions.

However, as another aspect of the present disclosure, the transparent adhesive layer of Examples 1 and 2, which is formed from the transparent adhesive composition including the silanol tackifier and the alkoxy silane compound, has the desired yellowness index and the haze value.

On the other hand, when the weight % of each of the silanol tackifier and the alkoxy silane compound is larger than about 5 with respect to the transparent adhesive composition, the transparent adhesive layer does not have the desired haze value (<1).

The transparent adhesive layer 200 according to another aspect of the present disclosure includes both the silanol compound and the alkoxy silane moiety and has the haze value being equal to or less than about 1 under the high temperature (about 50 to 85° C.) and the high humidity (about 50 to 85%) conditions. In addition, an increase amount of the haze value under the high temperature and high humidity conditions is less than 50% of an initial haze value. (about 250 hours after) Accordingly, the optical property of the display device is not deteriorated by the transparent adhesive layer 200.

Figure 5:
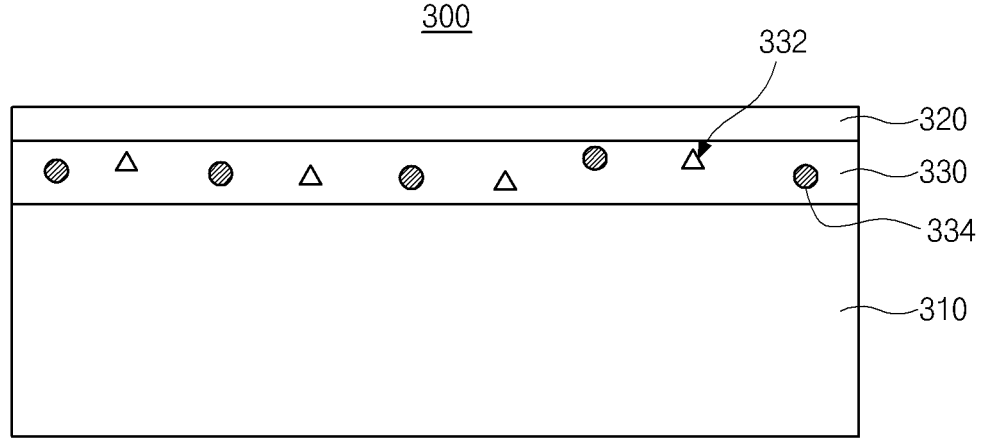
FIG. 5 is a schematic cross-sectional view of a display device according to yet another aspect of the present disclosure.

FIG. 5 is a schematic cross-sectional view of a display device according to a third embodiment of the present invention.

As shown in FIG. 5, the display device 300 according to yet another of the present disclosure includes a display device 310, a cover glass 320 disposed over a display surface side of the display panel 310 and a transparent adhesive layer 330 between the cover glass 320 and the display panel 310. The cover glass 320 and the display panel 310 are attached by the transparent adhesive layer 330.

Figure 6A:
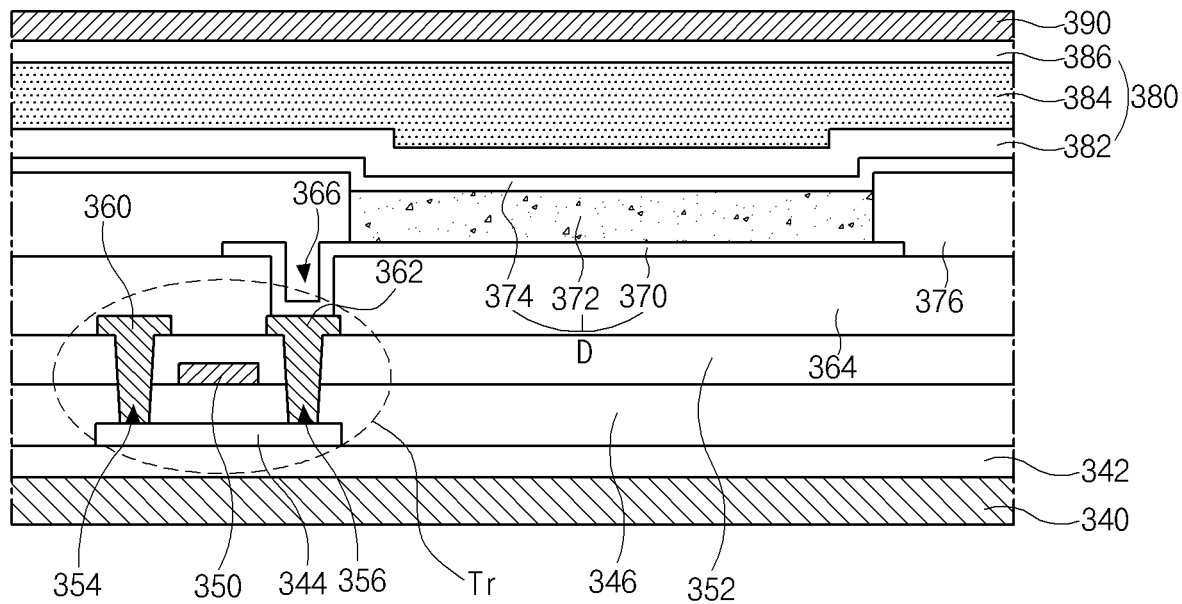
FIGS. 6A and 6B are schematic cross-sectional views of examples of a display panel, respectively.
Figure 6B:
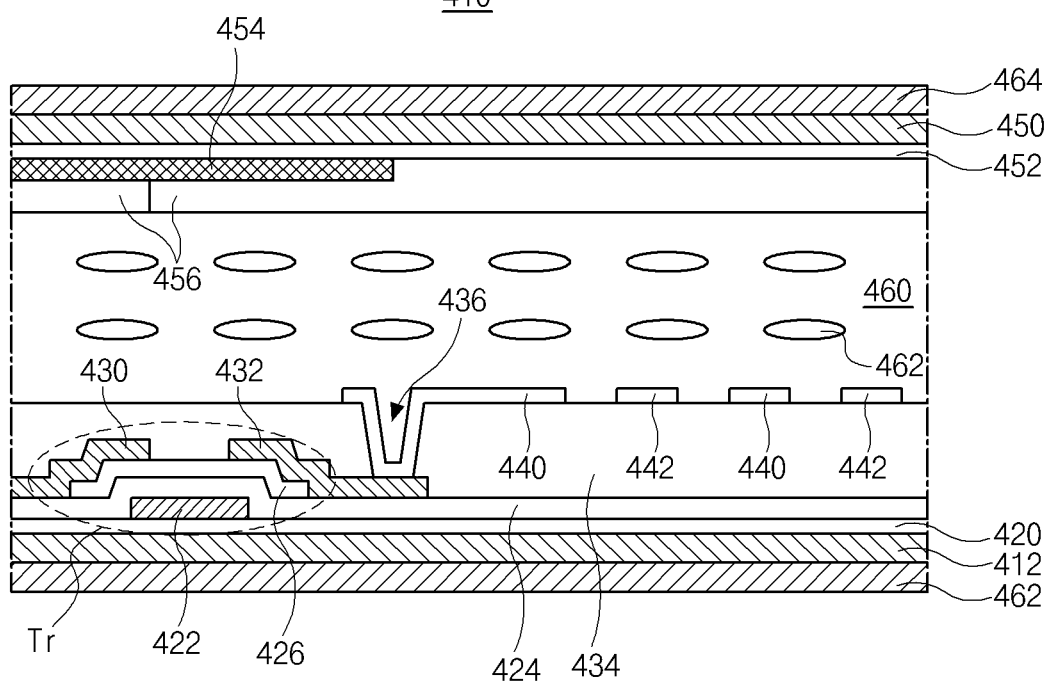

FIGS. 6A and 6B are schematic cross-sectional views of examples of a display panel, respectively.

As shown in FIG. 6A, the display panel 310 may be a light emitting diode panel.

For example, the display panel 310 may include a substrate 340, a thin film transistor (TFT) Tr positioned on or over the substrate 340, a light emitting diode D over the substrate 340 and connected to the TFT Tr and an encapsulation film 380 covering the light emitting diode D.

The substrate 340 may be a glass substrate or a flexible substrate of a metal or a plastic. For example, the substrate 340 may be a polyimide substrate.

The polyimide substrate 340 may not be adequate to the fabrication process for the elements of the display panel 310, e.g., the TFT Tr. Accordingly, with the polyimide substrate 340 attached onto the carrier substrate, e.g., a glass substrate, the TFT Tr may be formed on or over the polyimide substrate 340. Then, the polyimide substrate 340 is separated or released from the carrier substrate such that the display panel 310 may be provided.

A buffer layer 342 is formed on the substrate 340, and the thin film transistor (TFT) Tr is formed on the buffer layer 342. The buffer layer 342 may be formed of an inorganic insulating material such as silicon oxide or silicon nitride. The buffer layer 342 may be omitted.

A semiconductor layer 344 is formed on the buffer layer 342. The semiconductor layer 344 may include an oxide semiconductor material or polycrystalline silicon.

When the semiconductor layer 344 is formed of the oxide semiconductor material, a light-shielding pattern (not shown) may be formed under the semiconductor layer 344. The light to the semiconductor layer 344 is shielded or blocked by the light-shielding pattern such that thermal degradation of the semiconductor layer 344 can be prevented. On the other hand, when the semiconductor layer 344 is formed of polycrystalline silicon, impurities may be doped into both sides of the semiconductor layer 344.

A gate insulating layer 346 is formed on the semiconductor layer 344. The gate insulating layer 346 may be formed of an inorganic insulating material such as silicon oxide or silicon nitride.

A gate electrode 350, which is formed of a conductive material, e.g., metal, is formed on the gate insulating layer 346 to correspond to a center of the semiconductor layer 344.

In FIG. 6A, the gate insulating layer 346 is formed over the entire surface of the substrate 340. Alternatively, the gate insulating layer 346 may be patterned to have the same shape as the gate electrode 350.

An interlayer insulating layer 352, which is formed of an insulating material, is formed over the entire surface of the substrate 340 including the gate electrode 350. The interlayer insulating layer 352 may be formed of an inorganic insulating material, e.g., silicon oxide or silicon nitride, or an organic insulating material, e.g., benzocyclobutene or photo-acryl.

The interlayer insulating layer 352 includes first and second contact holes 354 and 356 exposing both sides of the semiconductor layer 344. The first and second contact holes 3 354 and 356 are positioned at both sides of the gate electrode 350 to be spaced apart from the gate electrode 350.

In FIG. 6A, the first and second contact holes 354 and 356 extend into the gate insulating layer 346. Alternatively, when the gate insulating layer 346 is patterned to have the same shape as the gate electrode 350, there may be no first and second contact holes 354 and 356 in the gate insulating layer 346.

A source electrode 360 and a drain electrode 362, which are formed of a conductive material, e.g., metal, are formed on the interlayer insulating layer 352. The source electrode 360 and the drain electrode 362 are spaced apart from each other with respect to the gate electrode 350 and respectively contact both sides of the semiconductor layer 344 through the first and second contact holes 354 and 356.

The semiconductor layer 344, the gate electrode 350, the source electrode 360 and the drain electrode 362 constitute the TFT Tr, and the TFT Tr serves as a driving element.

In FIG. 6A, the gate electrode 350, the source electrode 360 and the drain electrode 362 are positioned over the semiconductor layer 344. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may be formed of amorphous silicon.

Although not shown, a gate line and a data line are disposed on or over the substrate 340 and cross each other to define a pixel region. In addition, a switching element, which is electrically connected to the gate line and the data line, may be disposed on the substrate 340. The switching element is electrically connected to the TFT Tr as the driving element.

In addition, a power line, which is parallel to and spaced apart from the gate line or the data line, may be formed on or over the substrate 340. Moreover, a storage capacitor for maintaining a voltage of the gate electrode 350 of the TFT Tr during one frame, may be further formed on or over the substrate 340.

A passivation layer 364, which includes a drain contact hole 366 exposing the drain electrode 362 of the TFT Tr, is formed to cover the TFT Tr.

A first electrode 370, which is connected to the drain electrode 362 of the TFT Tr through the drain contact hole 366, is separately formed in each pixel region. The first electrode 370 may be an anode and may be formed of a conductive material having a relatively high work function. For example, the first electrode 370 may be formed of a transparent conductive material such as indium-tin-oxide (ITO) or indium-zinc-oxide (IZO).

A bank layer 376, which covers edges of the first electrode 370, is formed on the passivation layer 364. A portion of the first electrode 370 in the pixel region is exposed through an opening of the bank layer 376.

An organic emitting layer 372 is formed on the first electrode 370. The organic emitting layer 372 may have a single-layered structure of an emitting material layer formed of an emitting material. Alternatively, to improve emitting efficiency, the organic emitting layer 372 may have a multi-layered structure including a hole injection layer, a hole transporting layer, the emitting material layer, an electron transporting layer and an electron injection layer sequentially stacked on the first electrode 370.

A second electrode 374 is formed over the substrate 340 including the organic emitting layer 372. The second electrode 374 is positioned at the entire surface of the display area. The second electrode 374 may be a cathode and may be formed of a conductive material having a relatively low work function. For example, the second electrode 374 may be formed of aluminum (Al), magnesium (Mg) or Al—Mg alloy.

The first electrode 370, the organic emitting layer 372 and the second electrode 374 constitute the organic emitting diode D.

An encapsulation film 380 is formed on the organic emitting diode D to prevent penetration of moisture into the organic emitting diode D.

The encapsulation film 380 may have has a triple-layered structure of a first inorganic layer 382, an organic layer 384 and a second inorganic layer 386. However, it is not limited thereto.

A polarization plate 390 is disposed on the encapsulation film 380 to reduce an ambient light reflection. The polarization plate 390 may be a circular polarization film. However, the polarization plate 390 may be omitted.

On the other hand, as shown in FIG. 6B, a liquid crystal panel 410 may be used for the display panel 310 of FIG. 5.

The liquid crystal panel 410 includes first and second substrates 412 and 450, which face each other, and a liquid crystal layer 460, which includes liquid crystal molecules 462, therebetween.

A first buffer layer 420 is formed on the first substrate 412, and a TFT Tr is formed on the first buffer layer 412. The first buffer layer 420 may be omitted.

A gate electrode 422 is formed on the first buffer layer 420, and a gate insulating layer 424 is formed on the gate electrode 422. In addition, a gate line (not shown), which is connected to the gate electrode 422, is formed on the first buffer layer 420.

A semiconductor layer 426, which corresponds to the gate electrode 422, is formed on the gate insulating layer 424. The semiconductor layer 426 may include an oxide semiconductor material. Alternatively, the semiconductor layer may include an active layer of intrinsic amorphous silicon and an ohmic contact layer of impurity-doped amorphous silicon.

A source electrode 430 and a drain electrode 432, which are spaced apart from each other, are formed on the semiconductor layer 426. In addition, a data line (not shown), which is electrically connected to the source electrode 430 and crosses the gate line to define a pixel region, is formed.

The gate electrode 422, the semiconductor layer 426, the source electrode 430 and the drain electrode 432 constitute the TFT Tr.

A passivation layer 434, which includes a drain contact hole 436 exposing the drain electrode 432, is formed on the TFT Tr.

A pixel electrode 440, which is connected to the drain electrode 432 through the drain contact hole 436, and a common electrode 442, which is alternately arranged with the pixel electrode 440, are formed on the passivation layer 434.

A second buffer layer 452 is formed on the second substrate 450, and a black matrix 454, which shields a non-display region such as the TFT Tr, the gate line and the data line, is formed on the second buffer layer 452. In addition, a color filter layer 456, which corresponds to the pixel region, is formed on the second buffer layer 452. The second buffer layer 452 and the black matrix 454 may be omitted.

The first and second substrates 412 and 450 are attached with the liquid crystal layer 460 therebetween. The liquid crystal molecules 462 of the liquid crystal layer 460 is driven by an electric field between the pixel and common electrode 440 and 442.

First and second polarization plates 462 and 464, which have perpendicular transmission axes, are attached to an outer side of each of the first and second substrates 412 and 450.

Although not shown, first and second alignment layers may be formed over the first and second substrates 412 and 450 to be adjacent to the liquid crystal layer 460. In addition, a backlight unit may be disposed under the first substrate 412 to provide light.

As shown in FIG. 5, the cover glass 320 may be attached onto the display surface of the display panel 310 through the transparent adhesive layer 330.

For example, when the display panel 310 is the light emitting diode panel 310 in FIG. 6A, the transparent adhesive layer 330 contacts the polarization plate 390 and attaches the cover glass 320 onto the light emitting diode panel 310.

When the display panel 310 is the liquid crystal panel 410 in FIG. 6B, the transparent adhesive layer 330 contacts the second polarization plate 464 and attaches the cover glass 320 onto the liquid crystal panel 410.

Although not shown, when a touch panel may be positioned between the display panel 310 and the cover glass 320, the transparent adhesive layer 330 may contact the touch panel and attaches the cover glass 320 onto the touch panel.

The transparent adhesive layer 330 includes the polymer matrix (not shown) of silicon acrylate, the silanol tackifier 332 and the alkoxy silane moiety 334.

The heat-resistance property of the transparent adhesive layer 330 can be improved by the silicon acrylate polymer matrix, and the adhesion property is improved by the silanol tackifier 332. In addition, due to the alkoxy silane moiety 334, the haze problem in the transparent adhesive layer 330 is prevented, and the adhesion property of the transparent adhesive layer 330 can be further improved.

Accordingly, the transparent adhesive layer 330 of the present disclosure has excellent heat-resistance property and adhesion property without a haze problem. In the display device 300 including the transparent adhesive layer 330, a high quality image is provided without damage on the display panel 310 and a peeling problem of the cover glass 320.

It will be apparent to those skilled in the art that various modifications and variations can be made to the embodiments without departing from the scope of the appended claims. Thus, it is intended that the aspects are not limiting and modifications and variations are covered provided they come within the scope of the appended claims and their equivalents.

What is claimed is:

1. A transparent adhesive layer consisting of:
a polymer matrix of silicone acrylate;
a silanol compound of Formula (I) dispersed in the polymer matrix:

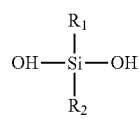

Formula (I)

wherein $R_1$ and $R_2$ are a C1 to C10 alkyl;
an optical initiator; and
an alkoxy silane moiety of Formula (III) chemically bonded to the polymer matrix:

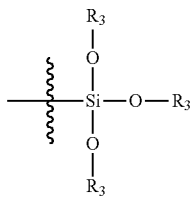

Formula (III)

wherein $R_3$ is a C1 to C20 alkyl,
wherein the transparent adhesive layer is formed by curing a composition consisting of a silicon-based compound, the optical initiator, the silanol compound and an alkoxy silane compound, wherein the silicon-based compound is a vinyl terminated polydimethylsiloxane or a thiol terminated polydimethylsiloxane,
wherein the silanol compound and the alkoxy silane compound are present in the composition in the same percentage by weight, and wherein the alkoxy silane compound is represented by formula V:

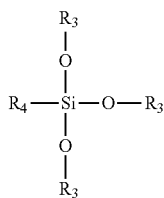

[Formula V]

wherein $R_4$ is an acrylate group and $R_3$ is a C1 to C20 alkyl.

2. The transparent adhesive layer of claim 1, wherein the silanol compound and the alkoxysilane compound are each present in the composition in an amount from 1 to 5 wt. % with respect to the silicone-based compound.

3. A display device comprising:
a display panel;
a cover glass over the display panel; and
the transparent adhesive layer of claim 1 between the display device and the cover glass.

4. The display device according to claim 3, further comprising a touch panel between the transparent adhesive layer and the display panel.

5. The display device according to claim 3, wherein the silanol compound and the alkoxysilane compound are each present in the composition in an amount from 1 to 5 wt. % with respect to the silicone-based compound.

6. The transparent adhesive layer of claim 1, wherein the silanol compound and the alkoxysilane compound are each present in the composition in an amount from 5 to 10 wt. % with respect to the silicone-based compound.

7. The transparent adhesive layer of claim 1, wherein the silanol compound is a compound of Formula (II):

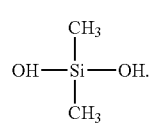

Formula (II)

8. The transparent adhesive layer of claim 1, wherein $R_3$ of the alkoxy silane moiety of Formula (III) is a C2 to C10 alkyl.

9. The transparent adhesive layer of claim 1, wherein the alkoxy silane moiety is a compound of Formula (IV):

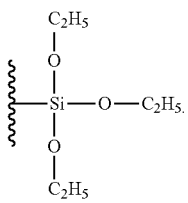

* * * * *